(12) United States Patent
Audet et al.

(10) Patent No.: US 7,420,378 B2
(45) Date of Patent: Sep. 2, 2008

(54) POWER GRID STRUCTURE TO OPTIMIZE PERFORMANCE OF A MULTIPLE CORE PROCESSOR

(75) Inventors: Jean Audet, Granby (CA); Louis B. Capps, Jr., Georgetown, TX (US); Glenn G. Daves, Fishkill, NY (US); Anand Haridass, Austin, TX (US); Ronald E. Newhart, Essex Junction, VT (US); Michael J. Shapiro, Austini, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/456,658

(22) Filed: Jul. 11, 2006

(65) Prior Publication Data

US 2008/0012583 A1    Jan. 17, 2008

(51) Int. Cl.
*G01R 31/08* (2006.01)
*G06F 19/00* (2006.01)

(52) U.S. Cl. .................. 324/713; 702/117; 713/300

(58) Field of Classification Search .................. 324/713, 324/765, 158.1; 713/300, 330; 702/117
See application file for complete search history.

(56) References Cited

U.S. PATENT DOCUMENTS

2006/0282692 A1 * 12/2006 Oh .............................. 713/300
2007/0239386 A1 * 10/2007 Capps et al. ................ 702/117

* cited by examiner

*Primary Examiner*—Vincent Q Nguyen
(74) *Attorney, Agent, or Firm*—Stephen R. Tkacs; Stephen J. Walder, Jr.; D'Ann N. Rifai

(57) ABSTRACT

A reduced number of voltage regulator modules provides a reduced number of supply voltages to the package. The package includes a voltage plane for each of the voltage regulator modules. Each core or other component on the die is tied to a switch on the package, and each switch is electrically connected to all of the voltage planes. A wafer-level test determines a voltage that optimizes performance of each core or other component. Given these voltage values, an engineer may determine voltage settings for the voltage regulator modules and which cores are to be connected to which voltage regulator modules. A database stores voltage setting data, such as the optimal voltage for each component, switch values, or voltage settings for each voltage regulator module. An engineering wire may permanently set each switch to customize the voltage supply to each core or other component.

8 Claims, 7 Drawing Sheets

POWER GRID STRUCTURE TO OPTIMIZE PERFORMANCE OF A MULTIPLE CORE PROCESSOR

BACKGROUND

1. Technical Field

The present application relates generally to an improved data processing system and method. More specifically, the present application is directed to a power grid structure to optimize performance of a multiple core processor.

2. Description of Related Art

In the early days of computing, engineers and designers were not concerned about how much power a processor used. Early processors had a single voltage level that was used by the motherboard and processor, typically 5 volts.

The amount of voltage is proportional to the amount of power used. Power consumption equates largely with heat generation, which is a primary enemy in achieving increased performance. With a growing number of computers in use, energy conservation has become an issue in computer design. Thus, as processors have increased in speed and size, designers have become more and more concerned about the amount of power being consumed. The first step to solve this concern was to reduce the voltage level to 3.3 volts.

Newer processors reduce voltage levels even more by using what is called a "dual voltage" or "split rail" design. A split rail uses two different voltages. The external or I/O voltage is higher, typically 3.3 volts, for compatibility with the other chips on the motherboard. The internal or "core voltage" is lower, usually 1.0 to 2.9 volts.

Multiple core processors complicate the issue of power consumption even further. The term "core" typically refers to a relatively large, general-purpose logic function that is used as a building block in a chip design. In a microprocessor, a central processing unit (CPU), or "processor." A multiple core processor has a plurality of processors. Within the context of this disclosure, a multiple core processor may also be referred to as a "system on a chip." In microprocessor design, processor manufacturers try to solve the concern about power consumption by using lower-power semiconductor processes and shrinking the die size, while still adding more and more functionality to the chip. As the die size shrinks and more components, such as processor cores, are packed into the processor design, variability in fabrication has a greater impact on performance and power consumption.

SUMMARY

The illustrative embodiments recognize the disadvantages of the prior art and provide a reduced number of voltage regulator modules provide a reduced number of supply voltages to a microprocessor package. The package includes a voltage plane for each of the voltage regulator modules. Each core or other component on the die is tied to a switch on the package, and each switch is electrically connected to all of the voltage planes.

In one illustrative embodiment, a method for optimizing performance of a multiple core processor die is provided. The multiple core processor die comprises a plurality of components. The method comprises setting a switch in a package for each component of the multiple core processor die based on an identified voltage value for each component. Each switch connects a component of the multiple core processor die to one of a plurality of voltage planes formed in the package. The number of voltage planes in the plurality of voltage planes is less than the number of components in the plurality of components. The method further comprises bonding the multiple core processor die to the package.

In one exemplary embodiment, the plurality of components comprises a plurality of processor cores. In another exemplary embodiment, the plurality of processor cores comprises a heterogeneous multiple core processor architecture. In a further embodiment, the plurality of components further comprises a memory component, an input/output logic component, or a pervasive logic component.

In another exemplary embodiment, the method further comprises storing in a database the identified voltage values for the plurality of components in association with a chip identifier of the multiple core processor die. In a further embodiment, the method further comprises storing the chip identifier on the multiple core processor die.

In yet another embodiment, the method further comprises determining a voltage value for each of a plurality of voltage regulator modules. Each voltage regulator module in the plurality of voltage regulator modules is configured to supply a voltage to one of the plurality of voltage planes in the package. In a further embodiment, the method further comprises storing the voltage value for each of the plurality of voltage regulator modules as a voltage identifier on the multiple core processor die.

In another illustrative embodiment, an apparatus for optimizing performance of a multiple core processor is provided. The apparatus comprises a testing device that identifies a voltage value for each component of a multiple core processor die. The multiple core processor die comprises a plurality of components. The apparatus further comprises a bond and assembly device that sets a switch in a package for each component of the multiple core processor die based on the identified voltage value for each component. Each switch connects a component of the multiple core processor die to one of a plurality of voltage planes formed in the package. The number of voltage planes in the plurality of voltage planes is less than the number of components in the plurality of components. The bond and assembly device is further configured to bond the multiple core processor die to the package.

In other exemplary embodiments, the apparatus performs various ones of the operations outlined above with regard to the method in the illustrative embodiments.

In another illustrative embodiment, a package for optimizing performance of a multiple core processor is provided. The package comprises a plurality of voltage planes and a plurality of switches. Each switch is configured to be set for each component of a multiple core processor die. The multiple core processor die comprises a plurality of components. Each switch is configured to connect a component of the multiple core processor die to one of the plurality of voltage planes. The number of voltage planes in the plurality of voltage planes is less than the number of components in the plurality of components.

In one exemplary embodiment, the package is bonded to the multiple core processor die.

In another exemplary embodiment, the package further comprises a coupling between each voltage plane and a corresponding one of a plurality of voltage regulator modules. The number of voltage regulator modules in the plurality of voltage regulator modules is equal to the number of voltage planes in the plurality of voltage planes.

In yet another exemplary embodiment, the package further comprises a coupling between each of a plurality of voltage identifiers stored on the multiple core processor die and a corresponding voltage regulator module in the plurality of voltage regulator modules.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use, further objectives and advantages thereof, will best be understood by reference to the following detailed description of an illustrative embodiment when read in conjunction with the accompanying drawings, wherein.

DETAILED DESCRIPTION OF THE PREFERRED EMBODIMENTS

Figure 1A:
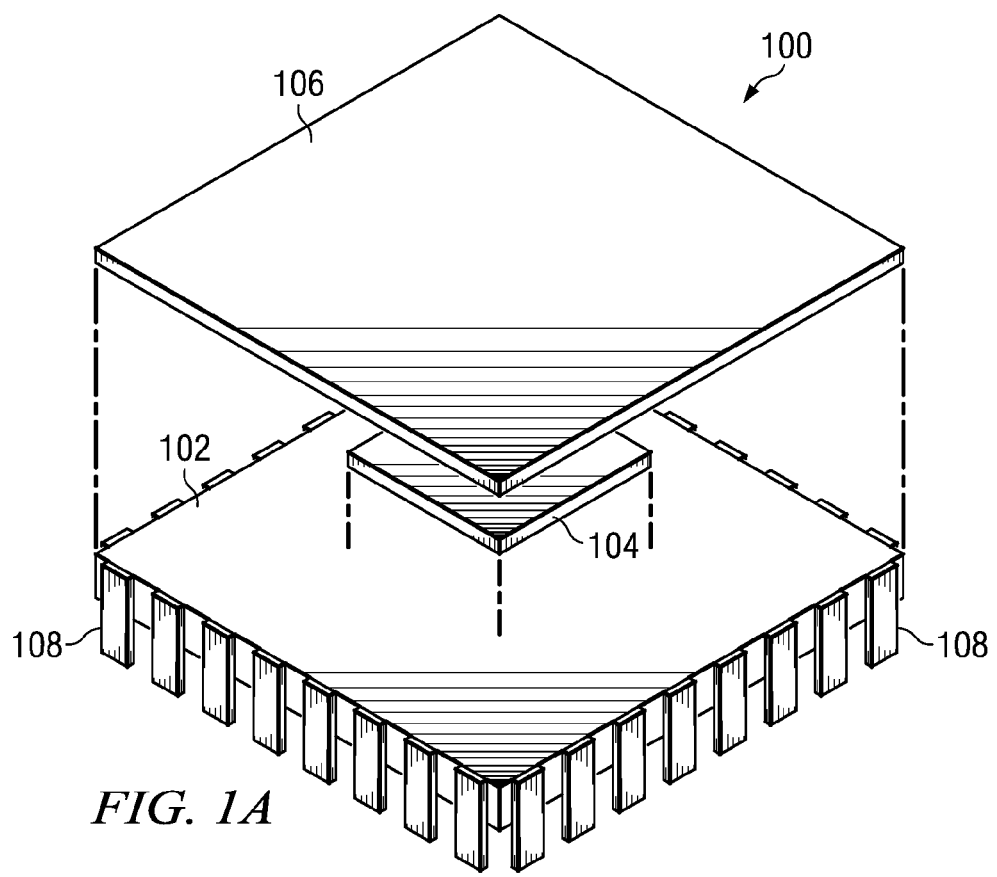
FIGS. 1A and 1B illustrate an example chip package assembly in which aspects of the exemplary embodiments may be implemented.
Figure 1B:
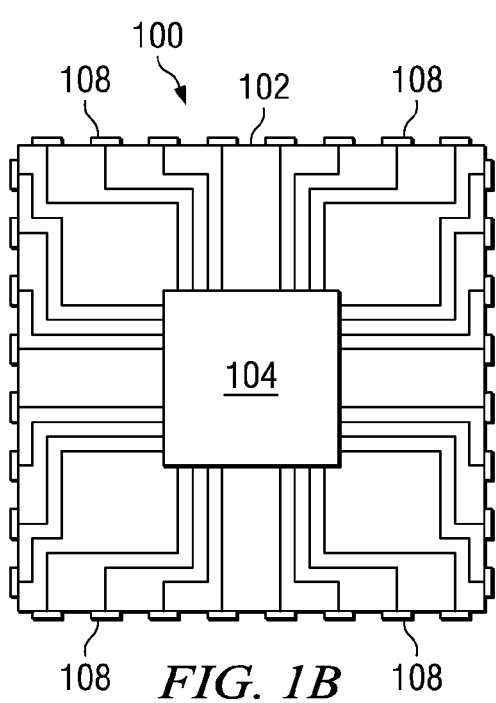

With reference now to the drawings, FIGS. 1A and 1B illustrate an example chip package assembly in which aspects of the exemplary embodiments may be implemented. More particularly, with reference to FIG. 1A, package assembly 100 includes die 104, which is placed on package 102. A die is an unpackaged piece of silicon containing the functional components of a device. "Die" is the formal term for the square of silicon containing an integrated circuit. A package is a housing that chips, or "dice" (plural of die), come in for plugging into or soldering onto printed circuit boards. Package 102 provides electrical wiring and connections to pins 108. Lid 106 covers die 104 and bonds with package 102.

Die 104 is bonded to package 102 using, for example, solder, controlled collapse chip connection (C4), or wire bond. A person of ordinary skill in the art will recognize that other package configurations may also be used, such as flip-chip, for example.

Although "chip" is sometimes used to refer to an entire package assembly, the word "chip" is often used as a synonym for "die." Creating a mounting for a chip might seem trivial to the uninitiated, but the ability to provide more and more input/output (I/O) interconnections to chips that are shrinking in size and growing in complexity is an ever-present problem.

A common chip package assembly is the dual in-line package (DIP). A DIP is a rectangular chip housing with leads (pins) on both long sides. Tiny wires bond the chip to metal leads that wind their way into spider-like feet that are inserted into a socket or soldered onto a circuit board. A ceramic dual in-line package (CDIP) is a type of ceramic DIP chip made of ceramic materials. A CDIP package is made of ceramic materials and uses gold-plated leads attached to two sides by brazing and a metal lid bonded to the chip with a metal seal. A CERDIP uses a ceramic lid that is bonded to the chip with a glass seal. A plastic leaded chip carrier (PLCC) package is a plastic, square, surface mount chip package that contains leads on all four sides. The leads (pins) extend down and back under and into tiny indentations in the housing. A ceramic quad (CERQUAD) package is a square, ceramic, surface mount chip package. A CERQUAD package uses a ceramic lid that is bonded to the chip with a glass seal. A CERQUAD package has pins on all four sides that wrap under like those of a PLCC package. Other package types are known to those skilled in the art, and aspects of the illustrative embodiments may be applied to any package type.

FIG. 1B illustrates a top-down, cross sectional view of package 100. Die 104 is surface mounted onto package 102. As seen in FIG. 1B, package 102 provides tiny wires to connect the components on die 104 with pins 108. Pins 108 provide connection to off-chip components. For example, if chip 104 is a processor, pins 108 may provide connection to system memory or a system bus, for example.

One component that may be connected to die 104 through one or more of pins 108 is a voltage regulator. A voltage regulator is a device or circuit that regulates the voltage fed to, typically, a microprocessor. The power supply of most personal computers generates power at 5 volts. However, most microprocessors require a voltage below 3.5 volts. The job of the voltage regulator is to reduce the 5 volt signal to the lower voltage required by the microprocessor.

Figure 2:
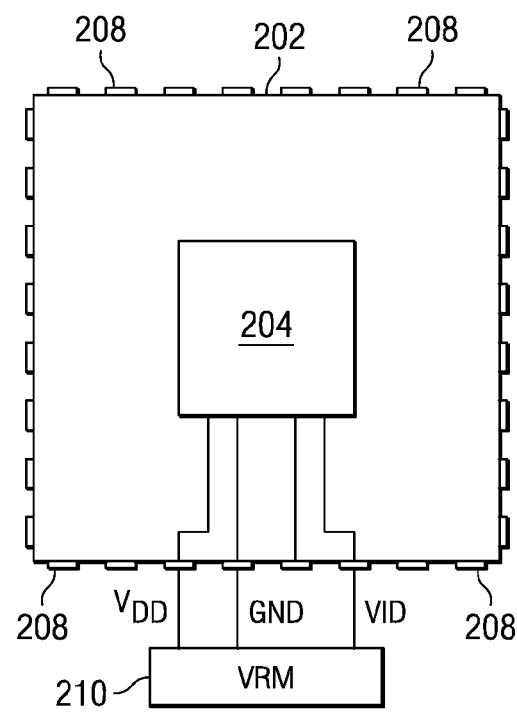
FIG. 2 illustrates a voltage regulator module connected to a chip through a package.

FIG. 2 illustrates a voltage regulator module connected to a chip through a package, as is typical in the prior art. In the depicted example, die 204 may be, for instance, a microprocessor. Voltage regulator module (VRM) 210 is connected to die 204 through the pins of package 202. Voltage regulator module 210 may provide a supply voltage ($V_{DD}$) and a ground signal (GND).

A voltage regulator module is an electronic device that provides a microprocessor the appropriate supply voltage. A voltage regulator module can be soldered to the motherboard, to which package 202 may also be soldered or connected using a socket mount, or the voltage regulator module may be an installable device. A voltage regulator module allows processors with different supply voltages to be mounted on the same motherboard.

Some voltage regulator modules provide a fixed supply voltage to the processor; however, most voltage regulator modules sense the required supply voltage from the processor. In the depicted example, microprocessor 204 communicates the correct supply voltage to voltage regulator module 210 via a number of bits called the voltage identifier (VID). In particular, voltage regulator module 210, which is part of processor 204, may initially provide a standard supply voltage to the VID logic. The aim of voltage regulator module 210 is to send the VID to the voltage regulator module. When voltage regulator module 210 receives the VID identifying the required supply voltage, it starts acting as a voltage regulator, providing the required constant voltage supply ($V_{DD}$) to the processor.

The processor configuration in FIG. 2 is a single-core microprocessor design. That is, the microprocessor in FIG. 2 has only one central processor unit (CPU), also referred to as a "processor" or "core." A single-core processor requires only one supply voltage, or perhaps two for a split-rail design where the processor is fed two voltages: the external or "I/O" voltage and the internal or "core" voltage. However, multiple core microprocessors complicate the issue of power consumption. Processor manufacturers try to solve the concern about power consumption by using lower-power semiconductor processes and shrinking the die size, while still adding more and more functionality to the chip. As the die size shrinks and more components are packed into the processor design, variability in fabrication has a greater impact on performance and power consumption.

Figure 3:
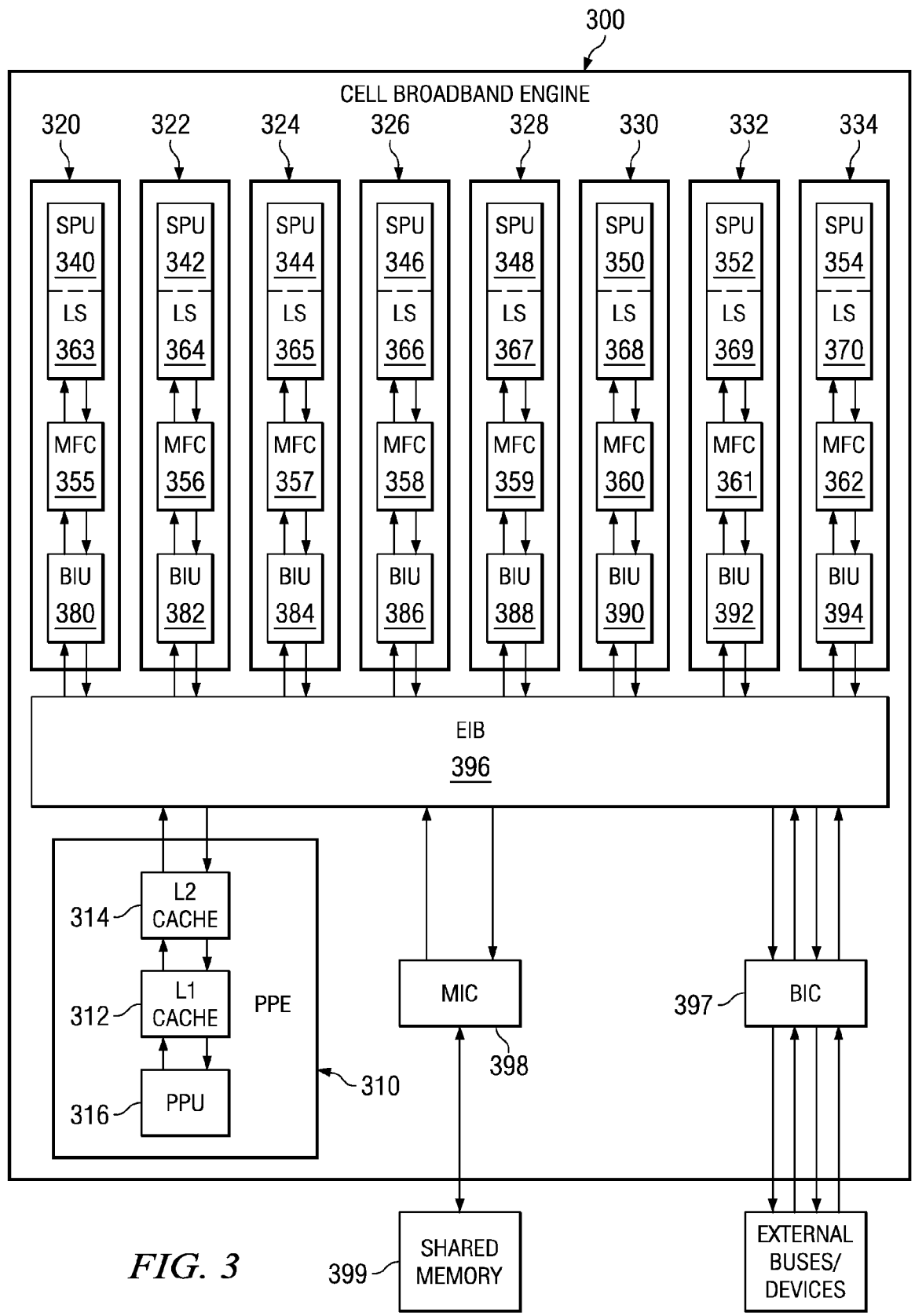
FIG. 3 is an exemplary block diagram of a data processing system in which aspects of the present invention may be implemented.

FIG. 3 is an exemplary block diagram of a data processing system in which aspects of the present invention may be implemented. The exemplary data processing system shown in FIG. 3 is an example of the Cell Broadband Engine (CBE) data processing system, wherein CBE processor 300 is a heterogeneous, multiple core data processor. CBE 300 will be used as an example of a multiple core data processor in the description of the illustrative embodiments of the present invention; however, the present invention is not limited to such, as will be readily apparent to those of ordinary skill in the art upon reading the following description.

As shown in FIG. 3, CBE processor 300 includes a power processor element (PPE) core 310 having a power processor unit (PPU) 316 and its L1 and L2 caches 312 and 314, and multiple synergistic processor element (SPE) cores 320-334 that each has its own synergistic processor unit (SPU) 340-354, memory flow control 355-362, local memory or store (LS) 363-370, and bus interface unit (BIU) 380-394, which may be, for example, a combination direct memory access (DMA), memory management unit (MMU), and bus interface unit. A high-bandwidth, internal element interconnect bus (EIB) 396, a bus interface controller (BIC) 397, and a memory interface controller (MIC) 398 are also provided. Accordingly, CBE processor 300 has a total of nine cores: one PPE core and eight SPE cores.

CBE processor 300 may be a system-on-a-chip such that each of the elements depicted in CBE processor 300 may be provided on a single microprocessor chip. Shared memory 399, as well as external busses and devices, are provided off chip. Moreover, CBE processor 300 is a heterogeneous processing environment in which each of the SPU cores may receive different instructions from each of the other SPU cores in the system. Moreover, the instruction set for the SPU cores is different from that of the PPU core, e.g., the PPU core may execute PowerPC™ Reduced Instruction Set Computer (RISC) based instructions while the SPU cores may execute vectorized instructions.

SPE cores 320-334 are coupled to each other and to the L2 cache 314 via the EIB 396. In addition, the SPE cores 320-334 are coupled to MIC 398 and BIC 397 via the EIB 396. The MIC 398 provides a communication interface to shared memory 399. The BIC 397 provides a communication interface between the CBE 300 and other external buses and devices.

PPE core 310 may be dual threaded. The combination of this dual threaded PPE 310 and the eight SPEs 320-334 makes CBE processor 300 capable of handling 10 simultaneous threads and over 128 outstanding memory requests. PPE core 310 acts as a controller for the other eight SPE cores 320-334, which handle most of the computational workload. PPE core 310 may be used to run conventional operating systems while SPE cores 320-334 perform vectorized floating point code execution, for example.

SPE cores 320-334 comprise a synergistic processing unit (SPU) 340-354, memory flow control units 355-362, local memory or store 363-370, and an interface unit 380-394. The local memory or store 363-370, in one exemplary embodiment, comprises a 256 KB instruction and data memory which is visible to PPE core 310 and can be addressed directly by software.

PPE core 310 may load SPE cores 320-334 with small programs or threads, chaining the SPE cores together to handle each step in a complex operation. For example, a set-top box incorporating CBE processor 300 may load programs for reading a DVD, video and audio decoding, and display, and the data may be passed off from SPE core to SPE core until it finally ends up on the output display. At 4 GHz, each SPE core 320-334 gives a theoretical 32 GFLOPS of performance with PPE core 310 having a similar level of performance.

The memory flow control units (MFCS) 355-362 serve as an interface for an SPU to the rest of the system and other elements. The MFCs 355-362 provide the primary mechanism for data transfer, protection, and synchronization between main storage and the local storages 363-370. There is logically an MFC for each SPU in a processor. Some implementations can share resources of a single MFC between multiple SPU cores. In such a case, all the facilities and commands defined for the MFC must appear independent to software for each SPU core. The effects of sharing an MFC are limited to implementation-dependent facilities and commands.

Multiple core microprocessors, such as CBE processor 300 shown in FIG. 3, may require separate voltages for each processor core in order to optimize performance. As mentioned above, the term "core" typically refers to a relatively large, general-purpose logic function that is used as a building block in a chip design. In this instance, a core may be a central processing unit (CPU), or "processor," such as PPE core 310 or SPE cores 320-334. As the number of cores grows, the cores of a multiple core microprocessor become more sensitive to variances in fabrication. Thus, the cores require different voltages to achieve optimal performance.

Figure 4:
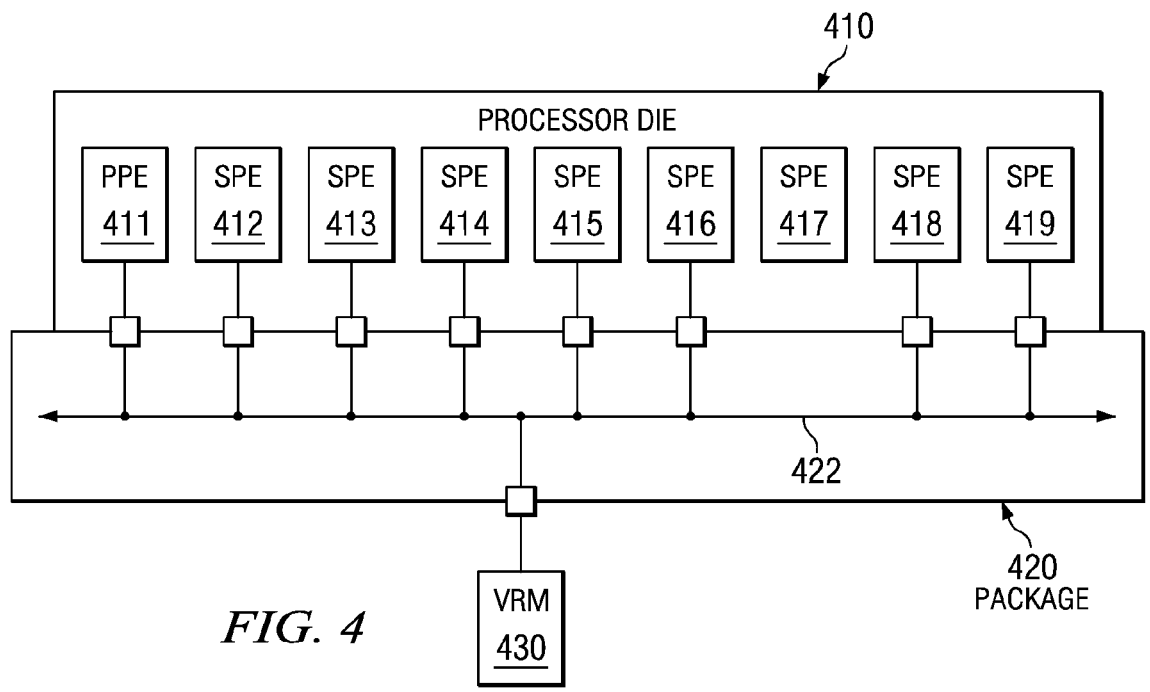
FIG. 4 is a block diagram depicting a multiple core processor with a single supply voltage in accordance with an illustrative embodiment.

One known solution to the problem of supplying voltage to a multiple core processor is to simply use a single voltage plane for the entire processor. FIG. 4 is a block diagram depicting a multiple core processor with a single supply voltage in accordance with an illustrative embodiment. As will be seen, the solution shown in FIG. 4 does not solve the problem of providing a different voltage to each core for optimal performance.

Processor die 410 includes power processor element core 411 and synergistic processor element cores 412-419. Eight synergistic processor element cores are shown; however, in this illustrative embodiment, synergistic processor element core 417 is disabled. During fabrication, there is a reasonable likelihood that a SPE core may be defective. Therefore, to increase the number of usable chips, each processor die is fabricated with a "spare" SPE core. If all SPE cores function properly, then the spare SPE core, perhaps SPE core 419, may be disabled. In the example depicted in FIG. 4, however, SPE core 417 may be defective and, thus, disabled.

In the depicted example, processor 410 may be a heterogeneous processing environment in which each of the SPU cores may receive different instructions from each of the other SPU cores in the system. Moreover, the instruction set for the SPU cores may be different from that of the PPU core, e.g., the PPU core may execute PowerPC™ Reduced Instruction Set Computer (RISC) based instructions while the SPU cores may execute vectorized instructions.

Processor die 410 is bonded to package 420. Package 420 includes a single voltage plane 422. A voltage plane is a horizontal, conductive layer within the package that carries the supply voltage to components on the surface of the substrate. In some cases, the voltage plane, if there is only one, is on the top surface of the package. However, in other cases, the ground plane is on the top layer. Of course, the voltage plane could be positioned in other layers within the substrate.

Voltage regulator module 430 supplies a supply voltage to voltage plane 422. Voltage regulator module 430 also provides a ground signal to a ground plane, although the ground plane is not shown for simplicity. Even though using a single supply voltage provides for a simple package design with a single voltage plane, a single supply voltage results in suboptimal performance. All cores must use the same supply voltage; thus, they must all run at the slowest common frequency. Therefore, the configuration shown in FIG. 4 has a large performance cost.

Figure 5:
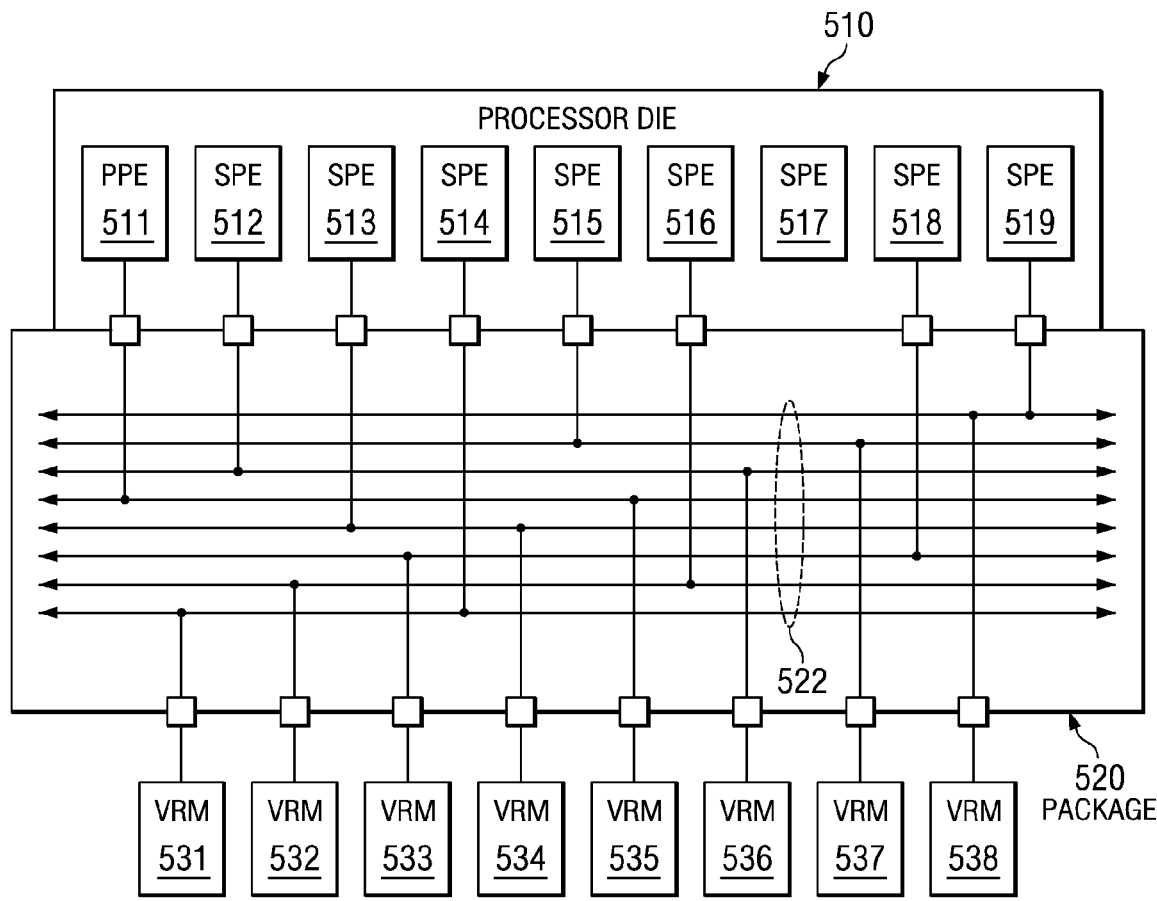
FIG. 5 is a block diagram depicting a multiple core processor with a supply voltage for each core in accordance with an illustrative embodiment.

Another known solution to the problem of supplying voltage to a multiple core processor is to keep adding voltage planes to the package. FIG. 5 is a block diagram depicting a multiple core processor with a supply voltage for each core in accordance with an illustrative embodiment. As will be seen, the solution depicted in FIG. 5 requires a large number of voltage planes in the package and a large number of voltage regulator modules, which greatly increases cost. Processor die 510 includes power processor element core 511 and synergistic processor element cores 512-519. In this illustrative embodiment, eight synergistic processor elements are shown; however, synergistic processor element core 517 is disabled for reasons explained above.

Processor die 510 is bonded to package 520. Package 520 includes eight voltage planes 522. Voltage regulator modules 531-538 provide supply voltages to respective ones of the voltage planes 522. Each of processor cores 511, 512, 513, 514, 515, 516, 518, and 519 is connected within package 520 to a respective one of voltage planes 522.

This solution provides optimal performance for each core of the processor. However, this solution also increases the wiring needed for each part on the chip, package, and board. It also increases the number of voltage regulator modules on the board. The configuration shown in FIG. 5 is costly to fabricate.

In accordance with an exemplary embodiment, a reduced number of voltage regulator modules provide a reduced number of supply voltages to the package. The package includes a voltage plane for each of the voltage regulator modules. Each core or other component on the die is tied to a switch on the package, and each switch is electrically connected to all of the voltage planes.

A wafer-level test determines a voltage that substantially optimizes performance of each core or other component. Given these voltage values, an engineer may determine voltage settings for the voltage regulator modules and which cores are to be connected to which voltage regulator modules. A database stores voltage setting data, such as a voltage value for each component, switch values, or voltage settings for each voltage regulator module.

Even though each core of a multiple core microprocessor may require a specific voltage for optimal performance, some cores may require the same voltage or voltages that are very close. On the other hand, other cores may require very different voltages. Considering an example with eight cores, the required voltages may be core1=2.2V, core2=2.1V, core3=1.6V, core4=1.4V, core5=2.6V, core6=2.0V, core7=2.2V, and core8=1.4V. Core1, core2, core6, and core7 are reasonably close. Core3 and core4 are also reasonably close. Therefore, three voltage regulator modules may be set to provide voltages of 2.1V, 1.5V, and 2.6V. Core1, core2, core6, and core7 may be connected to the 2.1V plane; core3 and core4 may be connected to the 1.5V plane, and core5 may be connected to the 2.6V plane. Thus, in this example, each core may receive an appropriate voltage for optimal or near optimal performance, while not requiring a voltage regulator module and voltage plane for each individual core.

The number of voltage regulator modules may be selected based on the number of cores or other components. In one exemplary embodiment, the ratio of cores (C) to voltage regulator modules (V) may range from C/V=2 to C/V=4. Thus, with eight cores, there may be two to four voltage regulator modules. As mentioned above, other components may be considered in addition to processor cores. A "core" may be any large block of functionality. Therefore, memory, I/O logic, and pervasive logic, for example, may also be considered "cores," and may receive voltages from the voltage regulator modules.

Figure 6A:
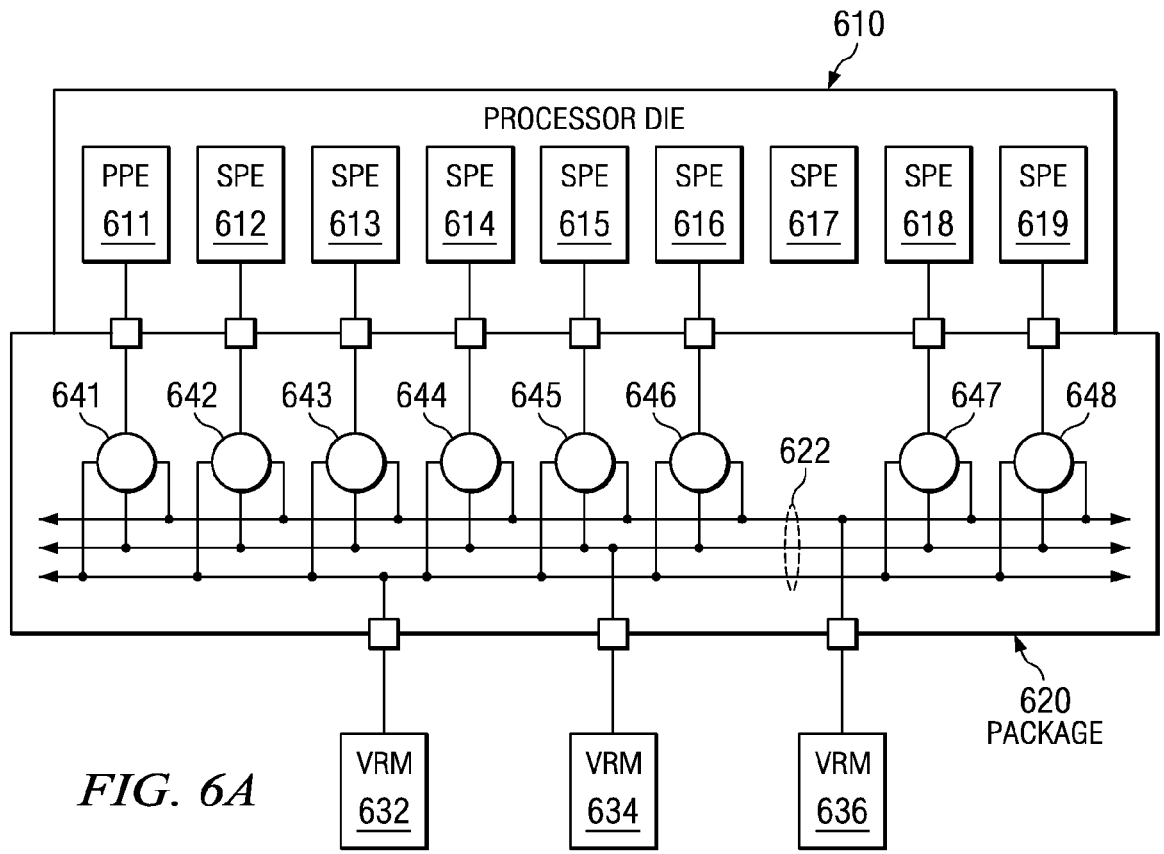
FIGS. 6A and 6B are block diagrams depicting a multiple core processor with multiple supply voltages in accordance with an illustrative embodiment.
Figure 6B:
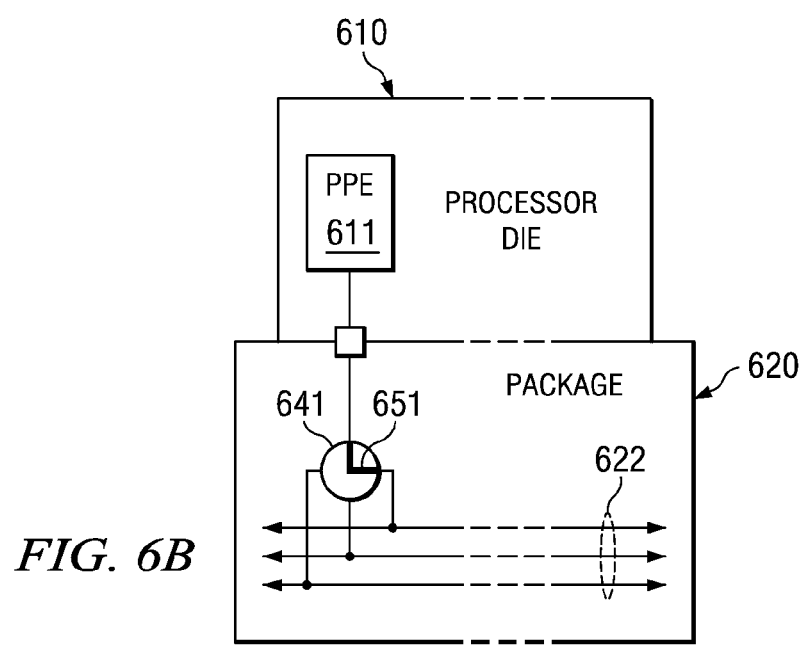

FIGS. 6A and 6B are block diagrams depicting a multiple core processor with multiple supply voltages in accordance with an illustrative embodiment. More particularly, with reference to FIG. 6A, processor die 610 includes power processor element core 611 and synergistic processor element cores 612-619. In this illustrative embodiment, eight synergistic processor element cores are shown; however, synergistic processor element 617 is disabled, for reasons stated above.

Processor die 610 is bonded to package 620. In the depicted example, package 620 includes three voltage planes 622. Voltage regulator modules 632, 634, 636 provide supply voltages to respective ones of the voltage planes 622. Each of processor cores 611, 612, 613, 614, 615, 616, 618, and 619 is connected within package 620 to a respective one of switches 641-648. In turn, each switch 641-648 is connected to each one of voltage planes 622.

A wafer level test, performed after processor die 610 is fabricated and possibly after a burn-in process, determines an optimal voltage for each core and stores these values in a database. Performance of processors, or processor cores in a multiple core microprocessor, is generally measured by speed or clock frequency. Due to variations in fabrication, the speed of a processor core may vary relative to the supplied voltage. Therefore, the wafer level test is used to determine a voltage at which a processor core effectively runs at a highest frequency. The wafer level test is generally known in the art and, therefore, a more detailed description is not provided herein.

When processor die 610 is bonded to package 620, switches 641-648 are physically, permanently set. Turning to FIG. 6B, processor die 610 is bonded to package 620. At the time of bonding the die to the package, engineering change wire 651 in switch 641 connects PPE core 611 to the appropriate voltage plane in voltage planes 622.

An engineer may form the switches in the package by wiring the supplied voltages to the surface of the substrate. Zero ohm resistors may connect the voltages to power grids. The zero ohm resistors are selectively attached to the surface of the substrate during the bond and assembly portion of the module build. The connection of the zero ohm resistors is varied according to the core information collected at wafer final test. Thus, this process customizes each substrate and power grid for the exact chip to which it is bonded.

Figure 7:
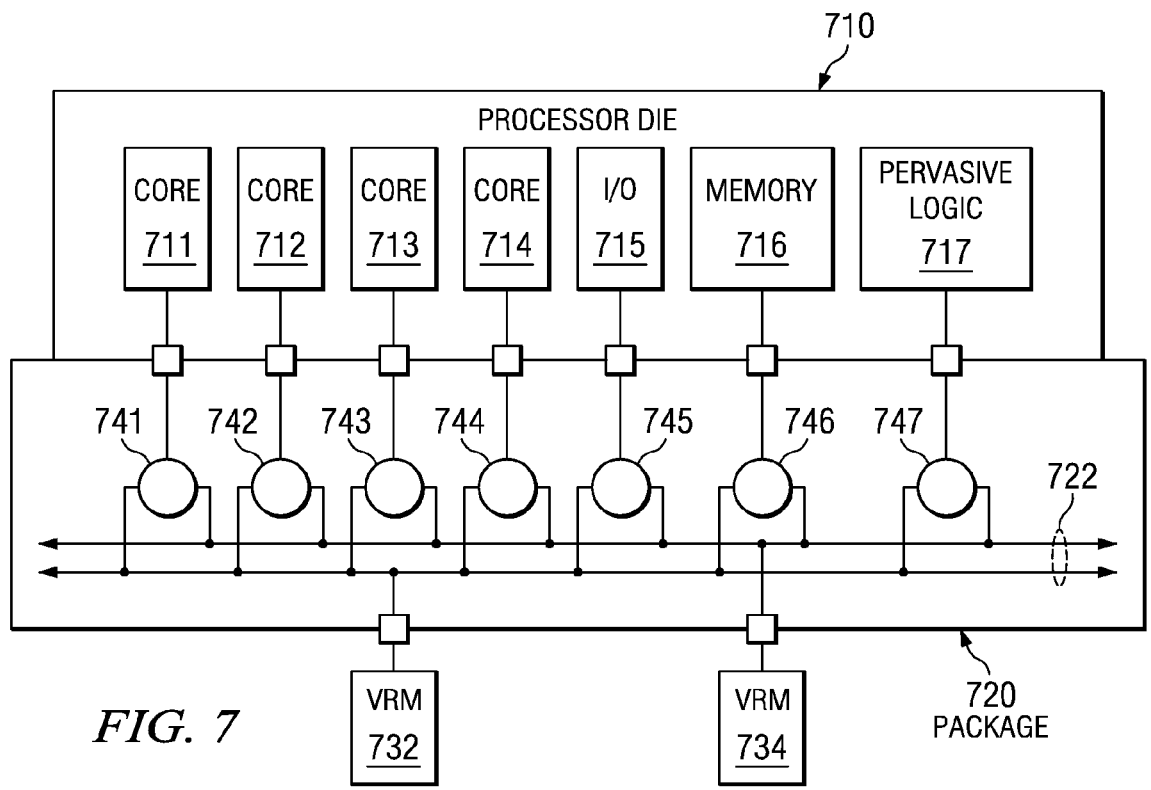
FIG. 7 is a block diagram depicting a multiple core processor with other components connected to multiple supply voltages in accordance with an illustrative embodiment.

FIG. 7 is a block diagram depicting a multiple core processor with other components connected to multiple supply voltages in accordance with an illustrative embodiment. Processor die 710 includes processor cores 711-714, I/O logic 715, memory 716, and pervasive logic 717. In this illustrative embodiment, four processor cores are shown with other logic components sharing the same set of voltage planes.

Processor die 710 is bonded to package 720. In the depicted example, package 720 includes two voltage planes 722. Voltage regulator modules 732, 734 provide supply voltages to respective ones of the voltage planes 722. Each of processor cores 711-714, as well as I/O logic 715, memory 716, and pervasive logic 717, is connected within package 720 to a respective one of switches 741-747. In turn, each switch 741-747 is connected to each one of voltage planes 722.

Figure 8:
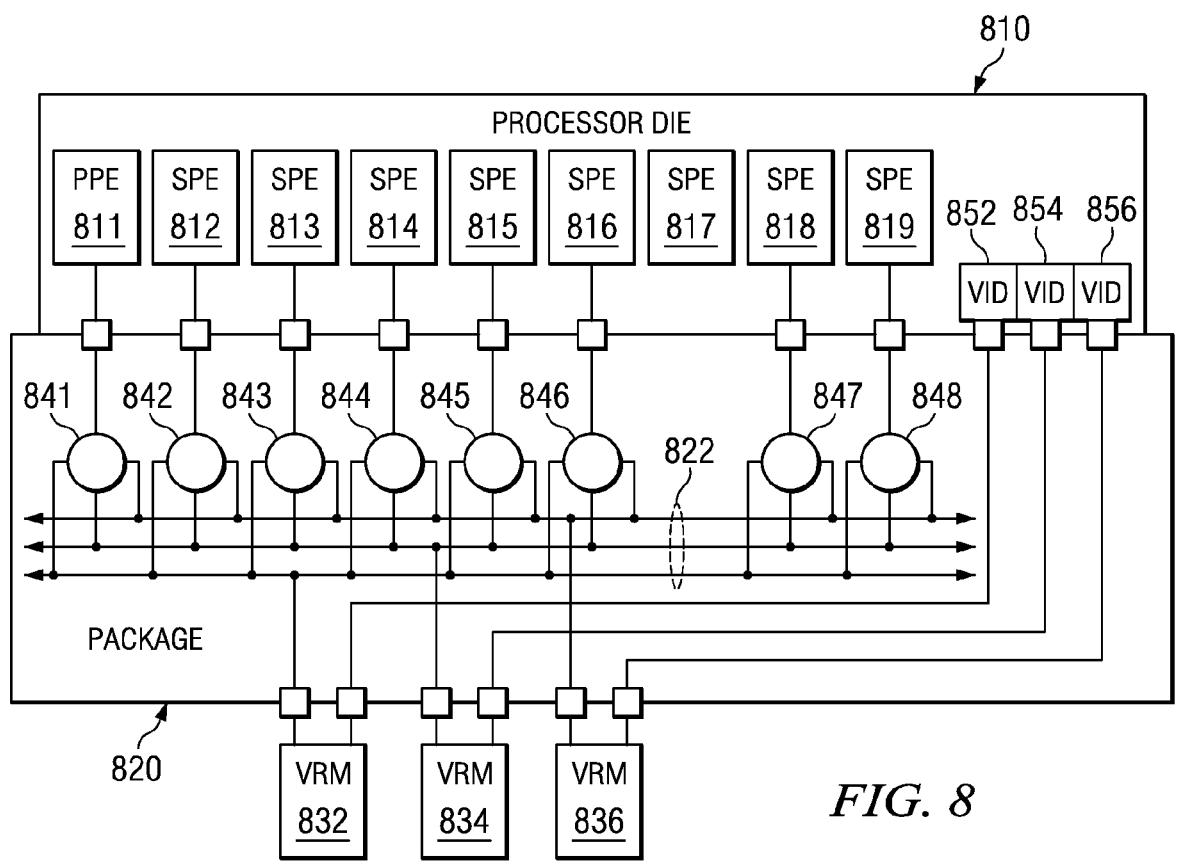
FIG. 8 is a block diagram depicting a multiple core processor with multiple supply voltages that are set using voltage identification signals from the processor in accordance with an illustrative embodiment.

As mentioned above, a voltage regulator module may sense the required supply voltage from the processor. The microprocessor may communicate the correct supply voltage to a voltage regulator module via a number of bits called the voltage identifier (VID). FIG. 8 is a block diagram depicting a multiple core processor with multiple supply voltages that are set using voltage identification signals from the processor in accordance with an illustrative embodiment. Processor die 810 includes power processor element 811 and synergistic processor elements 812-819. In this illustrative embodiment, eight synergistic processor elements are shown; however, synergistic processor element 817 is disabled for reasons mentioned above.

Processor die 810 is bonded to package 820. In the depicted example, package 820 includes three voltage planes 822. Voltage regulator modules 832, 834, 636 may initially provide a standard supply voltage to the VID logic 852, 854, 856. A wafer level test determines voltage values for the voltage regulator modules 832, 834, 836 for substantially optimal performance of cores 811-819. At this time, VID logic components 852, 854, 856 are encoded with VID values. This encoding may be accomplished by burning a series of fuses for each VID.

When voltage regulator modules 832, 834, 836 receive the VIDs identifying the respective supply voltages, they start acting as voltage regulators, providing the required constant voltage supplies to voltage planes 822. Each of processor cores 811, 812, 813, 814, 815, 816, 818, and 819 is connected within package 820 to a respective one of switches 841-848. In turn, each switch 841-848 is connected to each one of voltage planes 822.

At the time of bonding the die to the package, an engineering change wire in each switch 841-848 may connect each core 811, 812, 813, 814, 815, 816, 818, 819 to the appropriate voltage plane in voltage planes 822. Rather than supplying a fixed voltage, voltage regulator modules 832, 834, 836 supply voltages according to VIDs set in VID logic 852, 854, 856 in processor die 810.

Figure 9:
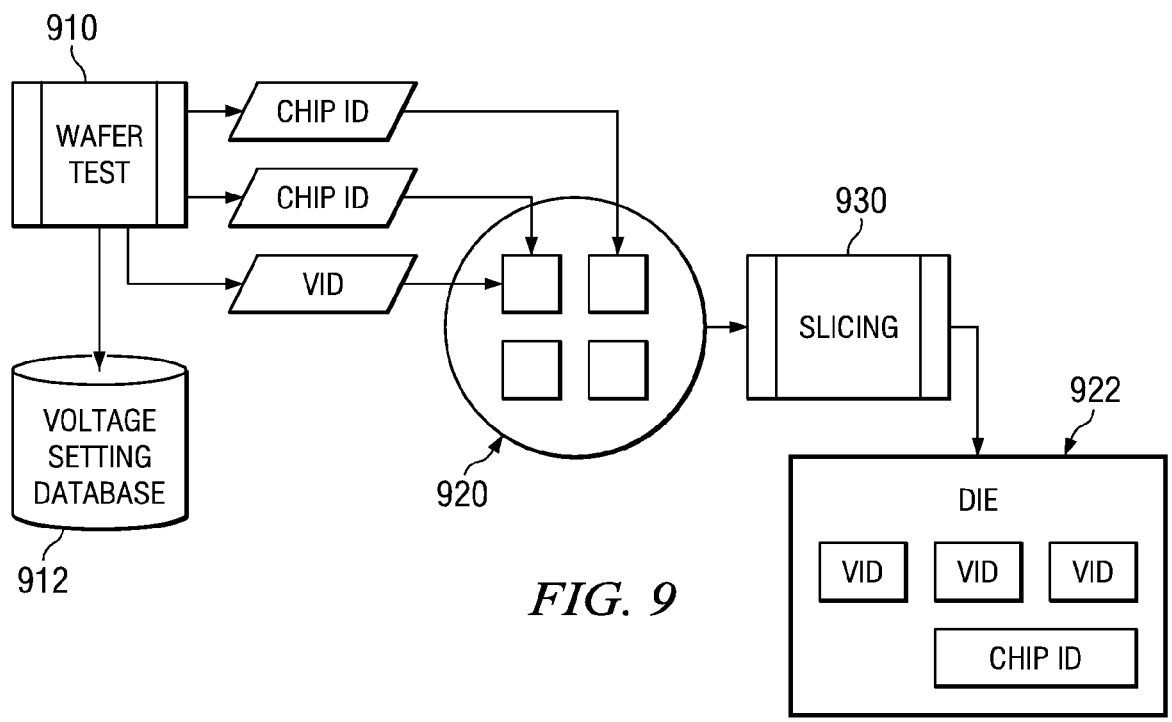
FIG. 9 is a pictorial representation of a wafer test and die slicing operation in accordance with an illustrative embodiment.

With reference now to FIG. 9, a pictorial representation of a wafer test and die slicing operation is shown in accordance with an illustrative embodiment. Wafer 920 includes a plurality of processor dies. Wafer test device 910 tests the dies on wafer 920 and stores a chip ID on each die. The chip ID is used to identify the particular die when it is being bonded to a package. The chip ID may be stored using a series of fuses on the die, for example. Wafer test device 910 may be similar to known testing devices, which are generally well-known for testing operational parameters and performance for integrated circuit devices.

Wafer test device 910 also determines a voltage for optimal performance of each distinct component on each die. The manner in which wafer test device 910 determines a voltage for each component on the die is generally known in the art and is not a focus of the instant disclosure. Wafer test device 910 may store these voltage values in database 912. Database 912 may store the voltage values in association with the chip ID of each die.

In one exemplary embodiment, wafer test device 910 determines a voltage for each voltage regulator module. Wafer test device 910 may store these values in association with the chip ID in database 912. In addition, wafer test device 910 may store each voltage value for the voltage regulators as a VID on the die. Thus, if each has eight cores and each package will have three different voltage planes from three voltage regulator modules, then wafer test device 910 may store three VIDs on each die.

Furthermore, if wafer test device 910 sets the VIDs for the voltage regulator modules for each die, then the switch settings may also be stored in database 912. Slicing process 930 slices wafer 920 into individual dies. Each die, such as die 922, has stored thereon a chip ID, as well as a VID for each voltage regulator.

Figure 10:
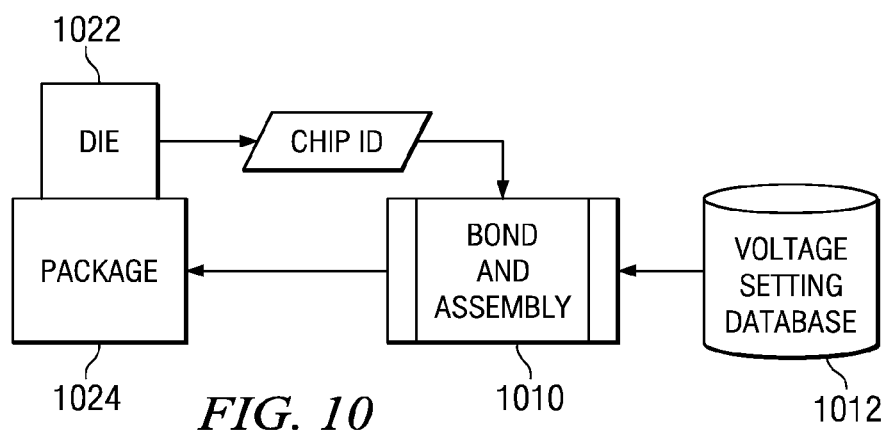
FIG. 10 is a pictorial representation of a bond and assembly operation in accordance with an illustrative embodiment.

FIG. 10 is a pictorial representation of a bond and assembly operation in accordance with an illustrative embodiment. Bond and assembly device 1010 reads the chip ID from die 1022. Bond and assembly device 1010 may be similar to known bond and assembly devices, which are generally well-known. In one embodiment, bond and assembly device 1010 obtains the voltage values from database 1012 and determines the switch values at the time of assembly. In an alternative embodiment, bond and assembly device 1010 obtains switch values from database 1012 and physically sets the switches in package 1024.

Figure 11:
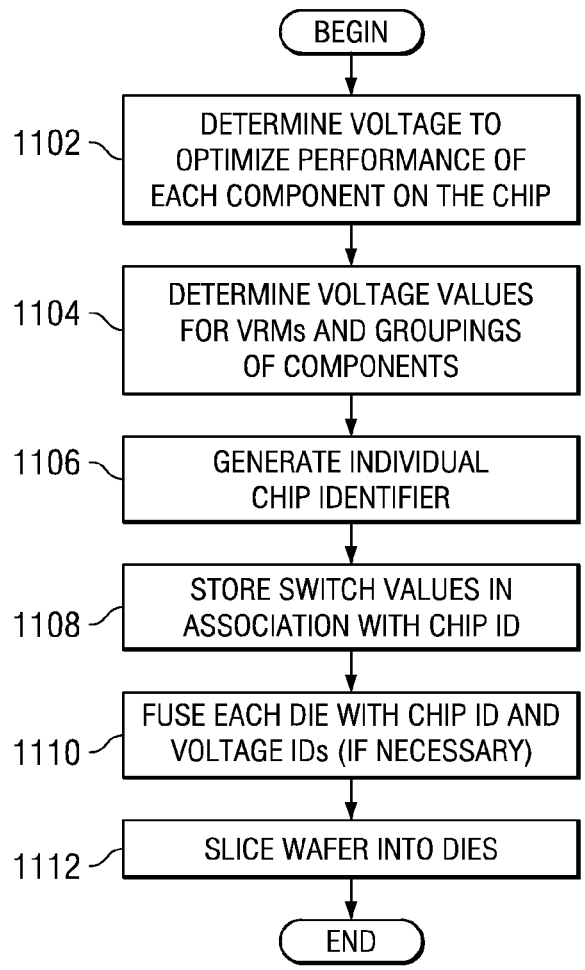
FIG. 11 is a flowchart illustrating the operation of wafer testing and slicing in accordance with an illustrative embodiment.

FIG. 11 is a flowchart illustrating the operation of wafer testing and slicing in accordance with an illustrative embodiment. It will be understood that each block of the flowchart illustrations, and combinations of blocks in the flowchart illustrations, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based computer systems which perform the specified functions or steps, or by combinations of special purpose hardware and computer instructions.

With reference now to FIG. 11, operation begins and the testing device determines a voltage to optimize performance of each component on the chip (block 1102). Performance of processors, or processor cores in a multiple core microprocessor, is generally measured by speed or clock frequency. Due to variations in fabrication, the speed of a processor core may vary relative to the supplied voltage. Therefore, the wafer level test is used to determine a voltage at which a processor core effectively runs at a highest frequency.

Next, the testing device determines the voltage values for the voltage regulators and the groupings of components on the chip (block 1104). This may be done manually by examining the voltage values and grouping cores that have similar voltage values. Alternatively, a computer program may use an algorithm to group the cores. Then, the testing device generates an individual chip identifier (block 1106) and stores the switch values in association with the chip ID in a database (block 1108). The testing device fuses each die with the chip ID and the voltage IDs, if necessary (block 1110). Thereafter, the slicing device slices the wafer into dies (block 1112), and operation ends.

Figure 12:
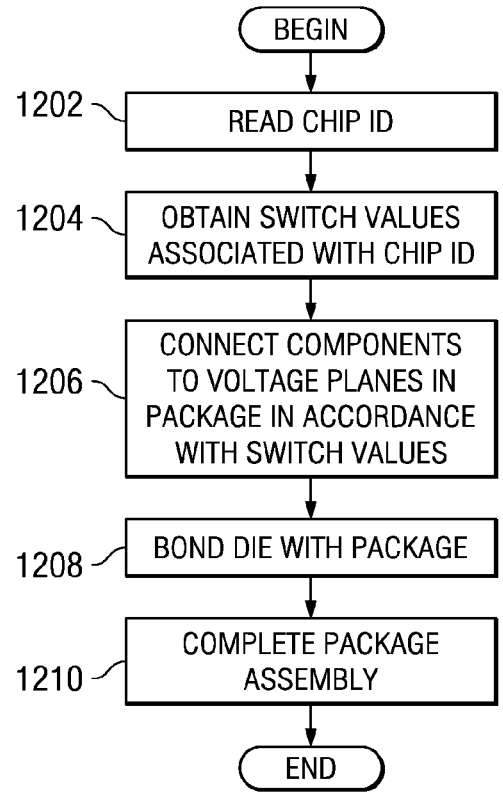
FIG. 12 is a flowchart illustrating operation of a bond and assembly operation in accordance with an illustrative embodiment.

FIG. 12 is a flowchart illustrating operation of a bond and assembly operation in accordance with an illustrative embodiment. Operation begins and the bond and assembly device reads the chip ID from the die (block 1202). Next, the bond and assembly device obtains switch values associated with the chip ID (block 1204) and connects the components to voltage planes in the package in accordance with the switch values (block 1206). The bond and assembly device bonds the die with the package (block 1208) and completes package assembly (block 1210). Thereafter, operation ends.

Thus, the exemplary embodiments solve the disadvantages of the prior art by providing a reduced number of voltage regulator modules to provide a reduced number of supply voltages to the package. The package includes a voltage plane for each of the voltage regulator modules. Each core or other component on the die is tied to a switch on the chip, and each switch is electrically connected to all of the voltage planes. A wafer-level test determines a voltage that optimizes performance of each core or other component. Given these voltage values, an engineer may determine voltage settings for the voltage regulator modules and which cores are to be connected to which voltage regulator modules. A database stores voltage setting data, such as the optimal voltage for each component, switch values, or voltage settings for each voltage regulator module.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for optimizing performance of a multiple core processor die, wherein the multiple core processor die comprises a plurality of components, the method comprising:
   setting a switch in a package for each component of the multiple core processor die based on an identified voltage value for each component, wherein each switch connects a component of the multiple core processor die to one of a plurality of voltage planes formed in the package and wherein the number of voltage planes in the plurality of voltage planes is less than the number of components in the plurality of components; and
   bonding the multiple core processor die to the package.

2. The method of claim 1, wherein the plurality of components comprises a plurality of processor cores.

3. The method of claim 2, wherein the plurality of processor cores comprises a heterogeneous multiple core processor architecture.

4. The method of claim 2, wherein the plurality of components further comprises a memory component, an input/output logic component, or a pervasive logic component.

5. The method of claim 1, further comprising:
   storing in a database the identified voltage values for the plurality of components in association with a chip identifier of the multiple core processor die.

6. The method of claim 5, further comprising:
   storing the chip identifier on the multiple core processor die.

7. The method of claim 1, further comprising:
   determining a voltage value for each of a plurality of voltage regulator modules, wherein each voltage regulator module in the plurality of voltage regulator modules is configured to supply a voltage to one of the plurality of voltage planes in the package.

8. The method of claim 7, further comprising:
   storing the voltage value for each of the plurality of voltage regulator modules as a voltage identifier on the multiple core processor die.

* * * * *